United States Patent
Oh et al.

(10) Patent No.: US 7,782,909 B2
(45) Date of Patent: Aug. 24, 2010

(54) FREQUENCY-TUNABLE TERAHERTZ LIGHT SOURCE DEVICE

(75) Inventors: Kwang Ryong Oh, Daejeon (KR); Jong Hoi Kim, Daejeon (KR); Dong Churl Kim, Daejeon (KR); Oh Kee Kwon, Daejeon (KR); Ki Soo Kim, Daejeon (KR); Ki Hong Yoon, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 189 days.

(21) Appl. No.: 12/192,527

(22) Filed: Aug. 15, 2008

(65) Prior Publication Data

US 2009/0135857 A1    May 28, 2009

(30) Foreign Application Priority Data

Nov. 26, 2007  (KR)  .................. 10-2007-0120608
May 22, 2008   (KR)  .................. 10-2008-0047433

(51) Int. Cl.
   *H01S 3/30* (2006.01)
(52) U.S. Cl. .......................................... 372/4
(58) Field of Classification Search .............. 372/4; 385/33, 125, 88–94
   See application file for complete search history.

(56) References Cited

U.S. PATENT DOCUMENTS 6,144,679 A * 11/2000 Herman et al. ............. 372/21

2003/0227668 A1   12/2003  Imai et al.
2004/0165639 A1*   8/2004  Lang et al. ................ 372/92
2005/0242287 A1   11/2005  Hakimi

FOREIGN PATENT DOCUMENTS

| EP | 1 353 218 A1 | 10/2003 |
|---|---|---|
| JP | 2000-235203 | 8/2000 |
| JP | 2003-5238 | 1/2003 |
| JP | 2006-162736 | 6/2006 |
| JP | 2006-313140 | 11/2006 |
| KR | 10-2007-0088356 | 8/2007 |
| WO | WO 2007/085573 A1 | 8/2007 |

OTHER PUBLICATIONS

Wilk et al., "Terahertz generation with 1064 nm DFB laser diode", Electronics Letters, vol. 43, No. 2, Jan. 18, 2007.
Iio et al., "Two-longitudinal-mode laser diodes", IEEE Photonics Technology Letters, vol. 7, No. 9, Sep. 1995, pp. 959-561.

* cited by examiner

*Primary Examiner*—Minsun Harvey
*Assistant Examiner*—Patrick Stafford
(74) *Attorney, Agent, or Firm*—Rabin & Berdo, PC

(57) ABSTRACT

Provided is a frequency-tunable terahertz light source device. The frequency-tunable terahertz light source device satisfies a Littrow diffraction condition at a wavelength and simultaneously satisfies a Littman-Metcalf diffraction condition at another wavelength using a double diffraction grating having two grating periods. Thus, oscillations simultaneously occur at the two different wavelengths, such that a terahertz wave can be stably generated by beating of the two oscillation wavelengths. In addition, the frequency-tunable terahertz light source device can readily change a frequency up to several terahertz and can be fabricated in a small size.

12 Claims, 2 Drawing Sheets

FREQUENCY-TUNABLE TERAHERTZ LIGHT SOURCE DEVICE

CROSS-REFERENCE TO RELATED APPLICATION

This application claims priority to and the benefit of Korean Patent Application Nos. 2007-120608, filed Nov. 26, 2007, and 2008-47433, filed May 22, 2008, the disclosures of which are incorporated herein by reference in their entirety.

BACKGROUND

1. Field of the Invention

The present invention relates to a frequency-tunable terahertz light source device, and more particularly, to a frequency-tunable terahertz light source device that can be miniaturized, stably generate a terahertz wave from two different modes and readily change a frequency.

This work was supported by the IT R&D program of MIC/IITA [2006-S-059-02, Development of ASON-based Metro Photonic Cross-Connect Technology].

2. Discussion of Related Art

Technology for fabricating a light source generating a terahertz wave that is an electromagnetic wave between light waves and microwaves has been recently researched.

Terahertz waves travel in a straight line as visible rays, penetrate various materials as electric waves, thus capable of sensing counterfeit bills, narcotics, explosives, biochemical weapons, etc., and checking industrial structures without demolition. Therefore, terahertz waves are expected to be widely used in the fields of general industry, national defense, security, etc., as well as basic science such as physics, chemistry, biology and medical science. Also in the field of information and communication technology, terahertz technology is expected to be extensively used for wireless communication at a data rate of 40 Gbit/s or more, high-speed data processing, and inter-satellite communication.

Thus far, several methods for generating a pulse-shaped terahertz wave and a continuous terahertz wave have been researched, including various techniques such as frequency doubling, a backward-wave oscillator, photomixing, a $CO_2$ pump laser, a quantum cascade laser and a free electron laser.

Among the above mentioned techniques of generating a terahertz wave, photomixing is used for generating a terahertz wave that can be changed, continuously oscillates and has a very small bandwidth.

According to photomixing, two laser beams having different wavelengths are spatially combined in a photoconductive material having carriers having a very short lifetime or in a Unitravelling-Carrier-Photodiode (UTC-PD), thereby generating a terahertz wave corresponding to a wavelength difference between the two laser beams.

When such photomixing is used, a terahertz wave is generated by interference between two laser beams having different wavelengths. Thus, a characteristic of the terahertz wave is determined according to characteristics of the two laser beams and mutual coherence between them.

Therefore, in order to implement a terahertz wave light source that can readily change a generated frequency and stably generate a terahertz wave from two different modes, two laser diodes must emit laser beams that are very stable and coherent with each other and have variable wavelengths. In addition, it is important to monolithically integrate the two laser diodes and implement them in a small size.

However, most techniques that have been hitherto used for photomixing control two longitudinal mode spacings of two high-power solid-state lasers or semiconductor lasers, thereby making a frequency difference between the two modes to be terahertz. Therefore, it is difficult for the techniques to stably generate a terahertz wave, change a generated frequency and be implemented in a small size module.

As an example, a method has been disclosed which inputs two excitation light beams to a waveguide to generate a high-power terahertz wave. However, the method has low efficiency in generating a terahertz wave and has a problem in stability because phase modulation between the frequencies of the two modes is impossible.

As another example, a method has been disclosed which designs a Distributed Feedback (DFB) laser to oscillate two side modes and generates a terahertz wave using a frequency difference between the two side modes. Since the method uses one gain medium, a dynamic range and a frequency are limited.

As yet another example, a method has been disclosed which generates a terahertz wave using a multisection DFB laser device comprising two DFB sections having different grating periods and a phase tuning section. According to the method, the variable wavelength range of the DFB laser is limited to several nanometers, and thus a difference between two modes is no more than several nanometers. Consequently, the frequency variation of the generated terahertz wave does not reach terahertz.

Wavelength-tunable light source devices (wavelength-tunable lasers) are in the limelight as the light source of Wavelength Division Multiplexing (WDM) optical communication systems. To change light of a single wavelength with light of a specific wavelength, external-resonator-type wavelength-tunable light source devices in Littman-Metcalf or Littrow configuration are generally used.

FIG. 1A illustrates the structure of a conventional external-resonator-type wavelength-tunable light source device in Littman-Metcalf configuration.

Referring to FIG. 1A, the external-resonator-type wavelength-tunable light source device in Littman-Metcalf configuration comprises a lens 130 for collimating beams generated from a laser diode 110 having a wide wavelength band, a diffraction grating 150 for diffracting the collimated beams, and a reflection mirror 170 for reflecting the diffracted beams.

When beams are generated from the laser diode 110, they are collimated by the lens 130, and the collimated beams are diffracted toward the reflection mirror 170 by the diffraction grating 150. The angle of the reflection mirror 170 with respect to the diffraction grating 150 is adjusted by a mechanical device (not shown), and thus the reflection mirror 170 reflects only perpendicularly incident light of a specific wavelength among incident wavelengths to the diffraction grating 150. The beam reflected to the diffraction grating 150 is diffracted again by the diffraction grating 150 and returns to the laser diode 110 through the lens 130.

In other words, in the external-resonator-type wavelength-tunable light source device in Littman-Metcalf configuration, the wavelength of a beam returning to the laser diode 110 varies according to the angle of the reflection mirror 170 with respect to the diffraction grating 150.

Meanwhile, an external-resonator-type wavelength-tunable light source device in Littrow configuration has a similar constitution to the external-resonator-type wavelength-tunable light source device in Littman-Metcalf configuration. However, in the external-resonator-type wavelength-tunable light source device in Littrow configuration, the angle of a diffraction grating other than a reflection mirror is adjusted to change a wavelength.

FIG. 1B illustrates the structure of an external-resonator-type wavelength-tunable light source device in Littrow configuration.

Referring to FIG. 1B, when beams are generated from a laser diode 110 in the external-resonator-type wavelength-tunable light source device in Littrow configuration, they are collimated by a lens 130, and a beam having a specific wavelength among the collimated beams is diffracted according to the angle of a diffraction grating 150 and returns to the laser diode 110 through the lens 130. In other words, the wavelength of a beam returning to the laser diode 110 varies according to the angle of the diffraction grating 150 with respect to the lens 130.

As described above, in the conventional external-resonator-type wavelength-tunable light source devices, a reflection mirror or diffraction grating is mechanically rotated to adjust an angle and select a beam of a specific wavelength, and thus must be mechanically and precisely rotated. Therefore, a high precision rotation device for selecting a specific wavelength is necessary, a tunable wavelength range is small, and it is difficult to miniaturize the corresponding module.

As a result, new technology is required for fabricating a light source that has a wide variable wavelength range and a high wavelength change rate, requires no structural movement, and can be readily miniaturized.

SUMMARY OF THE INVENTION

The present invention is directed to providing a frequency-tunable terahertz light source device that can be miniaturized, stably generate a terahertz wave from two different lasing modes, and readily change a frequency.

One aspect of the present invention provides a frequency-tunable terahertz light source device, comprising: first and second light sources for generating beams of various wavelengths; a lens for focusing the beams generated from the first and second light sources; and a double diffraction grating having first and second diffractors respectively diffracting the beams focused by the lens according to a Littrow diffraction condition and a Littman-Metcalf diffraction condition. Here, a terahertz wave is generated by beating of the beams diffracted by the first and second diffrators of the double diffraction grating.

The first diffractor of the double diffraction grating may have a first grating period to satisfy the Littrow diffraction condition at a first wavelength of a beam generated from the first light source, and the second diffractor of the double diffraction grating may have a second grating period to satisfy the Littman-Metcalf diffraction condition at a second wavelength having a specific wavelength interval with respect to the first wavelength of the beam generated from the first light source. In other words, the beam of the first wavelength is diffracted by the first diffractor of the double diffraction grating according to the Littrow diffraction condition and incident to the first light source through the lens, and the beam of the second wavelength is diffracted by the second diffractor of the double diffraction grating according to the Littman-Metcalf diffraction condition and incident to the second light source.

Therefore, the first and second light sources respectively generate resonant modes at the first and second wavelengths according to the Littrow diffraction condition and the Littman-Metcalf diffraction condition, and the terahertz wave is generated by beating between the beam of the first wavelength diffracted by the first diffractor of the double diffraction grating and the beam of the second wavelength diffracted by the second diffractor of the double diffraction grating.

Meanwhile, when the second light source comprises a laser diode array, the first light source may oscillate according to the Littrow diffraction condition, and one laser diode in the laser diode array may oscillate according to the Littman-Metcalf diffraction condition.

In addition, when a variable deflector having a refractive index varying according to an applied electrical signal is disposed in a path where the Littman-Metcalf diffraction occurs, a wavelength of the beam diffracted by the second diffractor of the double diffraction grating according to the Littman-Metcalf diffraction condition may continuously vary according to a change in the refractive index of the variable deflector, and a frequency of the terahertz wave may vary.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Figure 1A:
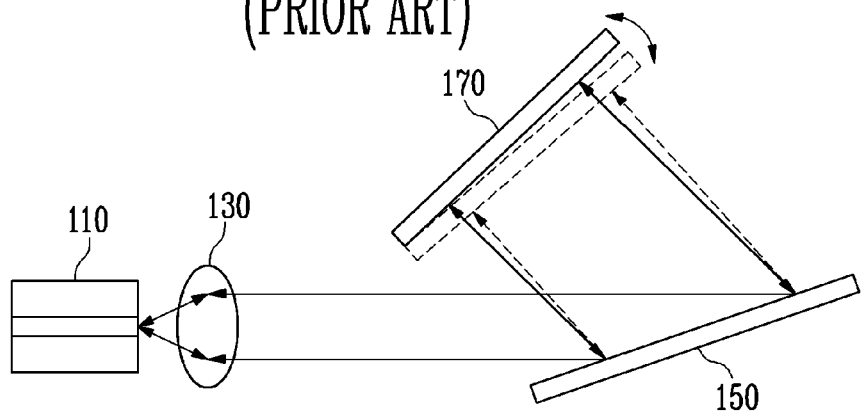
FIGS. 1A and 1B illustrate the structures of a conventional external-resonator-type wavelength-tunable light source device in Littman-Metcalf configuration and a conventional external-resonator-type wavelength-tunable light source device in Littrow configuration, respectively.
Figure 1B:
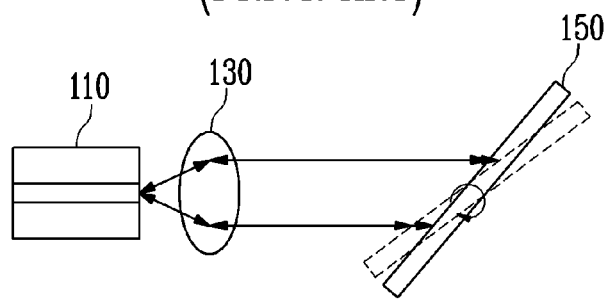
Figure 2:
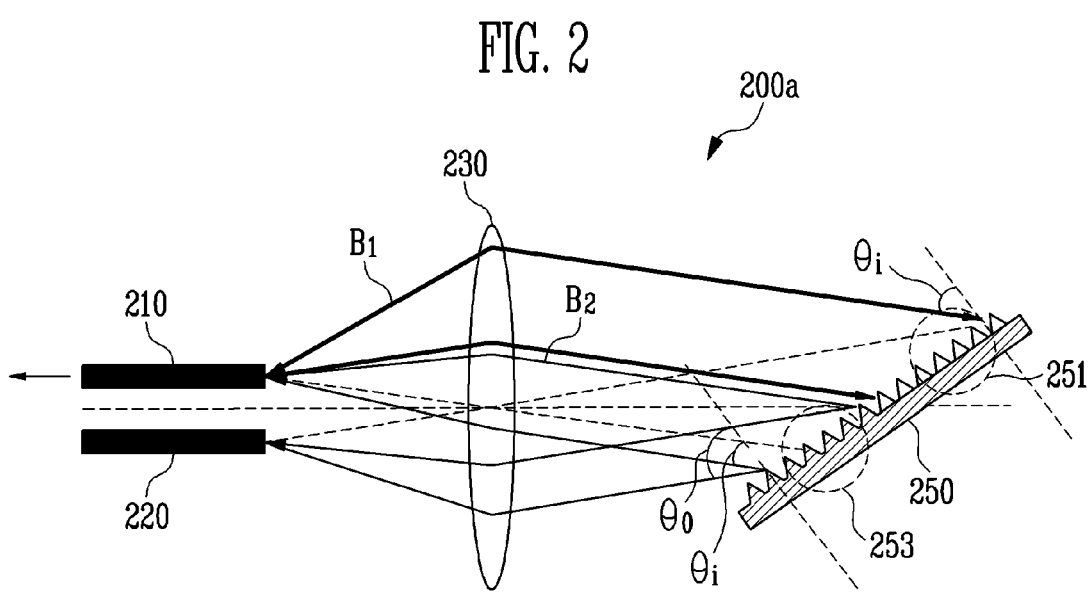
FIG. 2 illustrates a frequency-tunable terahertz light source device according to a first exemplary embodiment of the present invention.

FIG. 2 illustrates a frequency-tunable terahertz light source device 200a according to a first exemplary embodiment of the present invention.

Referring to FIG. 2, the frequency-tunable terahertz light source device 200a according to the first exemplary embodiment of the present invention comprises first and second light sources 210 and 220 that generate beams of various wavelengths, a lens 230 that focuses the beams generated from the first and second light sources 210 and 220, and a double diffraction grating 250 that diffracts the beams focused by the lens 230 toward the first and second light sources 210 and 220.

The first and second light sources 210 and 220 may be Fabry-Perot semiconductor lasers that generate beams of several wavelengths and have wide wavelength bands. A passive waveguide (not shown) may be coupled to the ends of the first and second light sources 210 and 220.

The double diffraction grating 250 comprises a first diffractor 251 having a first grating period $d_1$ and a second diffractor 253 having a second grating period $d_2$. Here, the first grating period $d_1$ is set to satisfy a Littrow diffraction condition, and the second grating period $d_2$ is set to satisfy a Littman-Metcalf diffraction condition.

More specifically, the present invention satisfies the Littrow diffraction condition at a first wavelength $\lambda_1$ and the Littam-Metcalf diffraction condition at a second wavelength $\lambda_2$ using the double diffraction grating 250 having the two grating periods $d_1$ and $d_2$. Thus, oscillations simultaneously occur at the first and second wavelengths $\lambda_1$ and $\lambda_2$ and a terahertz wave is generated by beating of the two oscillation wavelengths. This will be described in further detail below.

First, a beam $B_1$ of the first wavelength $\lambda_1$ among beams generated from the first light source 210 is focused by the lens 230 and incident to the double diffraction grating 250. The beam $B_1$ of the first wavelength $\lambda_1$ is diffracted according to the Littrow diffraction condition by the first diffractor 251 of the double diffraction grating 250 having the first grating period $d_1$, and returns to the first light source 210 through the lens 230.

Meanwhile, a beam $B_2$ of the second wavelength $\lambda_2$ among beams generated from the first light source 210 is focused by the lens 230 and incident to the double diffraction grating 250. The beam $B_2$ of the second wavelength $\lambda_2$ is diffracted according to the Littman-Metcalf diffraction condition by the second diffractor 253 of the double diffraction grating 250 having the second grating period $d_2$, and returns to the second light source 220 through the lens 230.

Here, relationship equations between the first and second wavelengths $\lambda_1$ and $\lambda_2$ and the first and second grating periods $d_1$ and $d_2$ are as shown in Equation 1 below.

$$m*\lambda_1 = n_{eff}*d_1*(\sin\theta_i)$$

$$m*\lambda_2 = n_{eff}*d_2*(\sin\theta_i + \sin\theta_o) \quad \text{[Equation 1]}$$

(here, m denotes a grating order, $n_{eff}$ denotes the effective refraction index of a beam, $\theta_i$ denotes an incidence angle, $\theta_o$ denotes a diffraction angle)

As shown in Equation 2 below, a wavelength interval $\Delta\lambda_{21}$ at which the first and second wavelengths $\lambda_1$ and $\lambda_2$ simultaneously resonate is calculated using Equation 1.

$$\Delta\lambda_{21} = \lambda_2 - \lambda_1 = n_{eff}*(d_2-d_1)*\sin\theta_i + d_2*\sin\theta_o \quad \text{[Equation 2]}$$

(here, m denotes a grating order, $n_{eff}$ denotes the effective refraction index of a beam, $\theta_i$ denotes an incidence angle, $\theta_o$ denotes a diffraction angle)

Therefore, while the first and second light sources 210 and 220 both are operating, they generate resonant modes at the first and second wavelengths $\lambda_1$ and $\lambda_2$ having the wavelength interval $\Delta\lambda_{21}$.

In other words, the beam $B_1$ of the first wavelength $\lambda_1$ oscillates according to the Littrow diffraction resonance conditions of the first light source 210 and the first diffractor 251, and the beam $B_2$ of the second wavelength $\lambda_2$ oscillates according to the Littman-Metcalf diffraction resonance conditions of the first and second light sources 210 and 220 and the second diffractor 253.

Here, beating occurs between the beam $B_1$ of the first wavelength $\lambda_1(=1/f_1)$ and the beam $B_2$ of the second wavelength $\lambda_2(=1/f_2)$ as shown in Equation 3 below, and finally a terahertz wave modulated at a frequency of $((f_1-f_2)/2)$ corresponding to the wavelength interval $\Delta\lambda_{21}$.

$$\sin(2\pi f_1 t) + \sin(2\pi f_2 t) = 2\cos\left(2\pi \frac{f_1-f_2}{2}t\right)\sin\left(2\pi \frac{f_1+f_2}{2}t\right) \quad \text{[Equation 3]}$$

Here, the first light source 210 may be designed not to be oscillated by the beam $B_2$ of the second wavelength $\lambda_2$, and the second light source 220 may be designed not to be oscillated by the beam $B_1$ of the first wavelength $\lambda_1$.

Meanwhile, since the first and second wavelengths $\lambda_1$ and $\lambda_2$ are simultaneously generated from the first light source 210, an oscillation characteristic may be unstable. This problem can be solved by properly controlling the gain of the second light source 220.

Second Exemplary Embodiment

Figure 3:
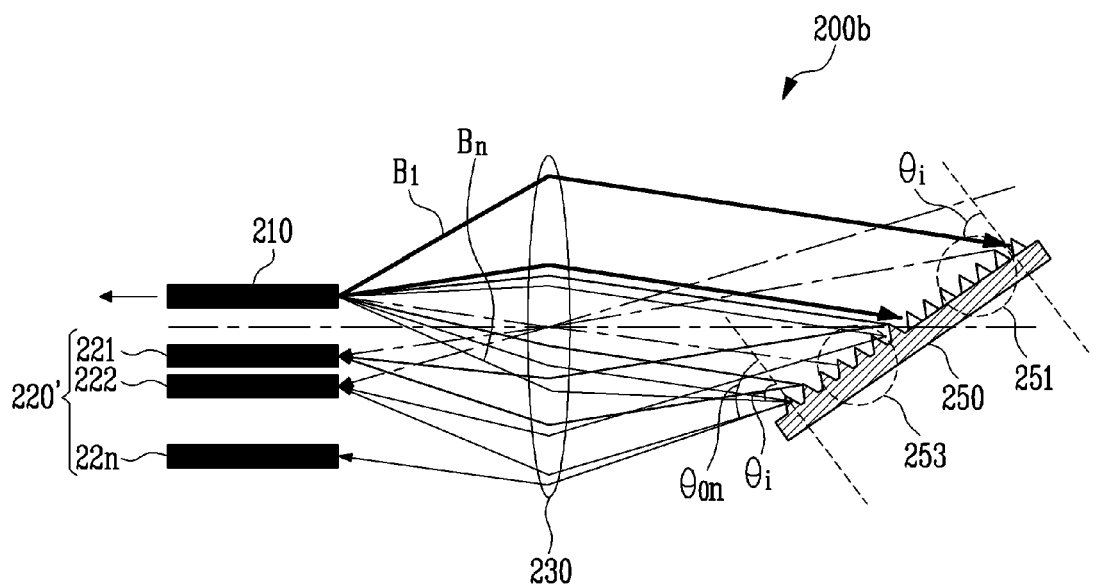
FIG. 3 illustrates a frequency-tunable terahertz light source device according to a second exemplary embodiment of the present invention.

FIG. 3 illustrates a frequency-tunable terahertz light source device 200b according to a second exemplary embodiment of the present invention, which has the same components as the frequency-tunable terahertz light source device 200a shown in FIG. 2 except that the second light source 220 of FIG. 2 comprises a laser diode array 220'.

Referring to FIG. 3, when current is applied and drives a first light source 210 and an n-th laser diode $22n$ of the laser diode array 220', the first light source 210 is oscillated by a beam $B_1$ of a first wavelength $\lambda_1$ diffracted according to the Littrow diffraction condition, and the n-th laser diode $22n$ is oscillated by a beam $B_n$ of an n-th wavelength $\lambda_n$ diffracted according to the Littman-Metcalf diffraction condition.

In other words, when the first light source 210 and the n-th laser diode $22_n$ are driven, a terahertz wave modulated at a frequency of $((f_1-f_n)/2)$ corresponding to a wavelength interval $\Delta\lambda_{n1}(=\lambda_n-\lambda_1)$ is generated by beating between the beam $B_1$ of the first wavelength $\lambda_1$ and the beam $B_n$ of the n-th wavelength $\lambda_n$.

Third Exemplary Embodiment

Figure 4:
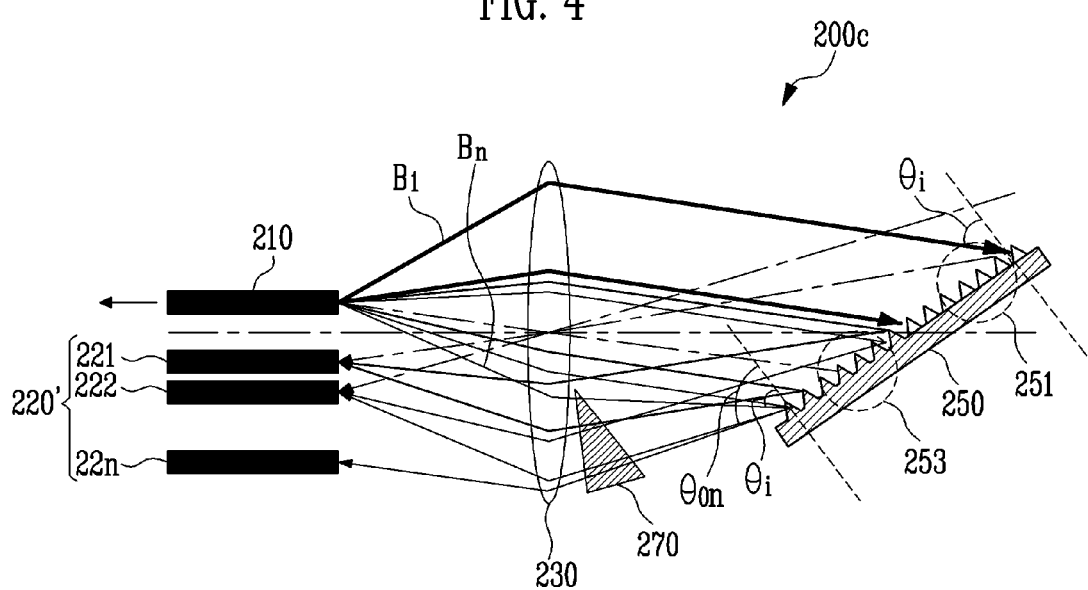
FIG. 4 illustrates a frequency-tunable terahertz light source device according to a third exemplary embodiment of the present invention.

FIG. 4 illustrates a frequency-tunable terahertz light source device 200c according to a third exemplary embodiment of the present invention, which has the same components as the frequency-tunable terahertz light source device 200b shown in FIG. 3 except that a triangular-shaped variable deflector 270 is disposed in a path where Littman-Metcalf diffraction occurs.

Referring to FIG. 4, only a beam $B_2$ of a second wavelength $\lambda_2$ diffracted by a second diffractor 253 of a double diffraction grating 250 according to the Littman-Metcalf diffraction condition passes through the variable deflector 270.

The refractive index of the variable deflector 270 varies according to an applied electrical signal. According to such a change in the refractive index of the variable deflector 270, the direction of the passed beam $B_2$ is changed, and also a resonant wavelength satisfying the Littman-Metcalf diffraction condition continuously varies.

Therefore, the frequency of a terahertz wave caused by a difference between resonant wavelengths satisfying the Littrow diffraction condition and the Littman-Metcalf diffraction condition also continuously varies.

For example, when a grating period $d_1$ of a first diffractor 251 is 4.4 μm, and an ambient refractive index is 3.258, a Littrow diffraction angle $\theta_1$ with respect to a beam of a wavelength of 1530 nm is calculated by Equation 1 above to be about 21.9 degrees. And, when a grating period $d_2$ of the second diffractor 253 is 3.3 μm, a Littman-Metcalf diffraction angle $\theta_2$ is 38.7 degrees, and a resonant wavelength is set to 1534 nm. In other words, resonant modes are generated at wavelengths of 1530 nm and 1534 nm.

Here, when the diffraction angle is continuously changed by the variable deflector 270 up to about 0.19 degrees, a Littman-Metcalf resonant wavelength is changed up to about 4 nm. Therefore, when the variable deflector 270 is inserted in the Littman-Metcalf diffraction path and driven, and first to n-th laser diodes 221 to 22n are driven in sequence, a frequency-tunable terahertz wave having an interval of 4×n nm can be generated. When there are ten laser diodes, a Littman-Metcalf resonant wavelength varying between 1534 nm and 1570 nm is set.

As a result, it is possible to design a frequency-tunable terahertz light source having a variable frequency range of several terahertz from 0.5 THz corresponding to a difference (up to 4 nm) between 1530 nm and 1534 nm to 5 THz corresponding to a difference (up to 40 nm) between 1530 nm and 1574 nm.

According to the present invention, it is possible to implement a frequency-tunable terahertz light source device that can be miniaturized, stably generate a terahertz wave from two different modes and readily change a frequency up to several terahertz.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A frequency-tunable terahertz light source device, comprising:
    first and second light sources for generating beams of various wavelengths;
    a lens for focusing the beams generated from the first and second light sources; and
    a double diffraction grating having first and second diffractors respectively diffracting the beams focused by the lens according to a Littrow diffraction condition and a Littman-Metcalf diffraction condition,
    wherein a terahertz wave is generated by beating of the beams diffracted by the first and second diffractors of the double diffraction grating.

2. The frequency-tunable terahertz light source device of claim 1, wherein the first diffractor of the double diffraction grating has a first grating period to satisfy the Littrow diffraction condition at a first wavelength, and the second diffractor of the double diffraction grating has a second grating period to satisfy the Littman-Metcalf diffraction condition at a second wavelength.

3. The frequency-tunable terahertz light source device of claim 2, wherein the first light source generates a beam of the first wavelength and a beam of the second wavelength, and the beams of the first and second wavelengths have a specific wavelength interval.

4. The frequency-tunable terahertz light source device of claim 3, wherein the beam of the first wavelength generated from the first light source is diffracted by the first diffractor of the double diffraction grating according to the Littrow diffraction condition, and is incident to the first light source.

5. The frequency-tunable terahertz light source device of claim 4, wherein the first light source is oscillated by the beam of the first wavelength diffracted according to the Littrow diffraction condition.

6. The frequency-tunable terahertz light source device of claim 3, wherein the beam of the second wavelength generated from the first light source is diffracted by the second diffractor of the double diffraction grating according to the Littman-Metcalf diffraction condition, and is incident to the second light source.

7. The frequency-tunable terahertz light source device of claim 6, wherein the second light source is oscillated by the beam of the second wavelength diffracted according to the Littman-Metcalf diffraction condition.

8. The frequency-tunable terahertz light source device of claim 3, wherein the beams of the first and second wavelengths are diffracted by the first and second diffractors of the double diffraction grating, and the terahertz wave having a specific wavelength interval is generated by beating of the diffracted beams of the first and second wavelengths.

9. The frequency-tunable terahertz light source device of claim 1, wherein when the second light source comprises a laser diode array, the first light source oscillates according to the Littrow diffraction condition, and one laser diode in the laser diode array oscillates according to the Littman-Metcalf diffraction condition.

10. The frequency-tunable terahertz light source device of claim 1, wherein a variable deflector having a refractive index varying according to an applied electrical signal is disposed in a path in which the Littman-Metcalf diffraction occurs.

11. The frequency-tunable terahertz light source device of claim 10, wherein a wavelength of the beam diffracted by the second diffractor of the double diffraction grating according to the Littman-Metcalf diffraction condition continuously varies according to a change in the refractive index of the variable deflector, and a frequency of the terahertz wave varies.

12. The frequency-tunable terahertz light source device of claim 1, wherein the first and second light sources are Fabry-Perot semiconductor lasers generating beams of various wavelengths.

* * * * *